United States Patent
Williams et al.

[11] Patent Number: 5,856,692
[45] Date of Patent: Jan. 5, 1999

[54] VOLTAGE-CLAMPED POWER ACCUMULATION-MODE MOSFET

[75] Inventors: Richard K. Williams, Cupertino; Shekar S. Mallikarjunaswamy, Santa Clara, both of Calif.

[73] Assignee: Siliconix incorporated, Santa Clara, Calif.

[21] Appl. No.: 459,054

[22] Filed: Jun. 2, 1995

[51] Int. Cl.$^6$ .......................... H10L 21/336; H10L 27/06; H10L 29/78

[52] U.S. Cl. .......................... 257/335; 257/339; 257/342; 257/368; 257/403

[58] Field of Search ................................ 257/328–332, 257/334, 335, 339, 341, 342, 343, 368, 394, 403, 356

[56] References Cited

U.S. PATENT DOCUMENTS

| | | | |
|---|---|---|---|
| 4,903,189 | 2/1990 | Ngo et al. | 363/127 |
| 5,430,315 | 7/1995 | Rumennik | 257/331 |

OTHER PUBLICATIONS

B.J. Baliga et al., "The Accumulation–Mode Field–Effect Transistor: A New Ultralow On–Resistance MOSFET", IEEE Electron Device Letters, vol. 13, No. 8, Aug. 1992, pp. 427–429.

T. Syau, "Comparison of Ultralow Specific On–Resistance UMOSFET Structures: The ACCUFET, EXTEET, INVFET, and Conventional UMOSFET's", IEEE Transactions on Electron Devices, vol. 41, No. 5, May 1994, pp. 800–808.

*Primary Examiner*—Peter Toby Brown
*Assistant Examiner*—Hung Van Duong
*Attorney, Agent, or Firm*—Skjerven, Morrill, MacPherson, Franklin & Friel; David E. Steuber

[57] ABSTRACT

An accumulation-mode power MOSFET includes a trenched gate that is formed in a semiconductor material of a first conductivity type. A region of second conductivity type is formed in the substrate (which may include an epitaxial layer) and a PN junction formed by the region of second conductivity type is connected in parallel with the current path through the accumulation-mode MOSFET. The diode is designed to have a breakdown voltage was causes the diode to break down before the oxide layer surrounding the gate can be ruptured or otherwise damaged when the MOSFET is in an off condition.

20 Claims, 9 Drawing Sheets

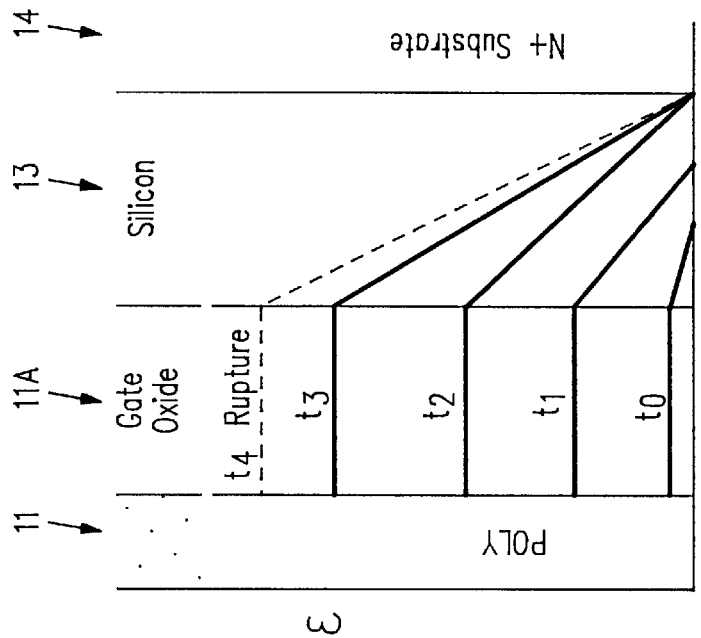
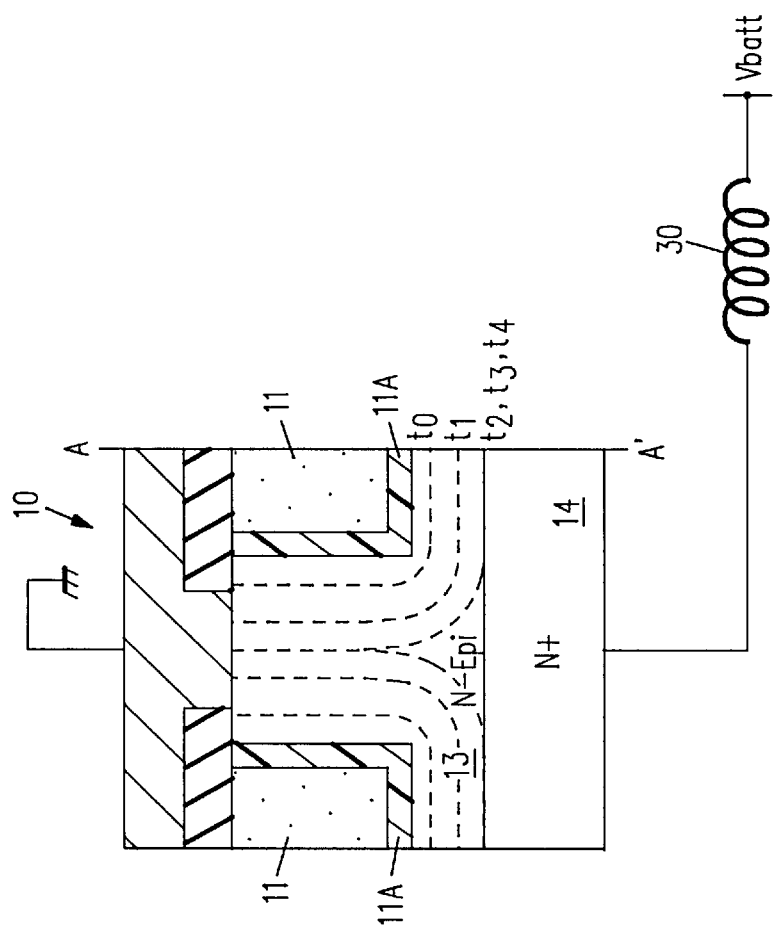
FIG. 3B
FIG. 3A

VOLTAGE-CLAMPED POWER ACCUMULATION-MODE MOSFET

CROSS REFERENCE TO RELATED APPLICATION

This application is related to Application Ser. No. 08/459,559, filed concurrently herewith, which is incorporated herein by reference in its entirety.

FIELD OF THE INVENTION

This invention relates to power accumulation-mode field-effect transistors and, in particular, to a power accumulation-mode field-effect transistor having a greater voltage blocking capability.

BACKGROUND OF THE INVENTION

Accumulation mode field-effect transistors, sometimes referred to as "ACCUFETs", are trench-type MOSFETs which contain no body region and hence no PN junctions. The region between the trenched gates, sometimes called a "mesa", is made relatively narrow (e.g., 0.5 to 4.0 μm wide), and the gate material (typically polysilicon) is doped in such a way that it has a work function which depletes the entire mesa region, much like a junction field-effect-transistor (JFET). The current path extends between a "source" at the top of the mesa and a "drain" at the bottom of the substrate. The trenches are normally formed entirely in an epitaxial layer which is grown on top of the substrate.

A cross-sectional view of a typical ACCUFET 10 is illustrated in FIG. 1. Trenched gates 11 are etched in a silicon material 12, which includes an N-epitaxial layer 13 grown on an N+ substrate 14. Trenched gates 11 define two cells 10A and 10B. An N+ source 15 is formed at the top of the mesa between gates 11. A metal layer 16 is formed over the source regions, and a power source 17 and a load 18 are connected between the N+ source 15 and the N+ substrate 14, which acts as the drain.

ACCUFET 10 is turned off when the gate voltage is equal to the source voltage (i.e., $V_{gs}=0$). If $V_{gs}$ is increased, the depletion regions surrounding the gates (shown by the dashed lines) contract and open a current path between the source and the drain. With further increasing $V_{gs}$ the depletion regions continue to contract until eventually accumulation regions are formed adjacent the trenches, enhancing channel conduction and further lowering the on-resistance of the device.

This sequence of events is illustrated in FIGS. 2A, 2B and 2C, FIG. 2A showing ACCUFET 10 in the off condition, FIG. 2B showing ACCUFET 10 turned partially on, and FIG. 2C showing ACCUFET 10 turned fully, with the accumulation regions being designated by the numeral 19. In FIGS. 2B and 2C the arrows represent the flow of electrons from the source to the drain.

Additional information concerning ACCUFETs is given in U.S. Pat. No. 4,903,189 to Ngo et al.; B. J. Baliga et al., "The Accumulation-Mode Field-Effect Transistor: A New Ultralow On-Resistance MOSFET", IEEE Electron Device Letters, Vol. 13, No. 8, August 1992, pp. 427–429; and T. Syau et al., "Comparison of Ultralow Specific On-Resistance UMOSFET Structures: The ACCUFET, EXTFET, INVFET, and Conventional UMOSFET's", IEEE Electron Device Letters, Vol. 41, No. 5, May 1994, pp. 800–808, each of which is incorporated herein by reference in its entirety.

ACCUFETs can be fabricated with a very high cell density and a very low on-resistance. Despite these advantages, ACCUFETs have not so far achieved widespread use in the field of power semiconductor devices for several reasons. One of the principal reasons is their inability to withstand high voltages when they are in an off condition.

This problem is illustrated in FIGS. 3A and 3B, which show oxide layers 11A bordering gates 11. FIG. 3A shows ACCUFET 10 connected to an inductive load 30. The symbols $t_0$, $t_1$, $t_2$, $t_3$ and $t_4$ represent sequential times in the process of turning off ACCUFET 10. The dashed lines in FIG. 3A represent the edges of the spreading depletion region at times $t_0$, $t_1$, $t_2$, $t_3$ and $t_4$. FIG. 3B illustrates the strength of the electric field in the gate oxide layer 11A and epitaxial layer 13 at times $t_0$, $t_1$, $t_2$, $t_3$ and $t_4$. As shown, as $V_{gs}$ begins to decrease at time $t_0$, the electric field resides in the gate oxide layer 11A and a portion of epitaxial layer 13. At times $t_1$ and $t_2$, the strength of the field in the gate oxide layer 11A has increased somewhat, but a portion of the increase is absorbed by the epitaxial layer 13. At time $t_2$, however, the electric field has reached the interface between epitaxial layer 13 and N+ substrate 14. Since N+ substrate 14 is heavily doped, it cannot support an electric field to any significant extent, and thus all further increases in the field must be taken up in the limited space of gate oxide layer 11A and epitaxial layer 13. This means that the electric field in the gate oxide layer 11A begins to increase at a faster rate with decreases in $V_{gs}$. Unless limited in some way, the increases may eventually rupture gate oxide layer 11A, and in FIG. 3B this is shown as occurring at time $t_4$. When the gate oxide layer has been ruptured, the device is generally destroyed beyond repair.

Since many loads (such as load 30) include an inductive component, voltage spikes inevitably occur in the power lines as the loads are switched on and off. The inability of ACCUFETs to withstand these voltage spikes has seriously limited their use in the power MOSFET field.

Push-pull halfbridge circuit 40, shown in FIG. 4A, illustrates the problem that occurs when using ACCUFETs with an inductive load. Halfbridge circuit 40 includes a high-side ACCUFET 41 and a low-side ACCUFET 42, which drive a coil 43 in a motor, for example. ACCUFETs 41 and 42 are connected in series between a battery voltage $V_{batt}$ and ground. FIG. 4B shows the voltages ($V_{GS}$) across the gate oxides of the ACCUFETs 41 and 42 and the voltage $V_o$ at the output of the halfbridge circuit. Assume that at a starting point, $V_o$ is low, meaning that high-side ACCUFET 41 is off and low-side ACCUFET 42 is on. With ACCUFET 42 on, generally some current will be flowing through ACCUFET 42 and coil 43. In this situation the gate of ACCUFET 42 is tied to $V_{batt}$ and the gate of ACCUFET 41 is tied to a voltage equal to $V_o$, so that the $V_{GS}$ in ACCUFET 41 is zero.

In order to switch $V_o$ from low to high, low-side ACCUFET 42 is turned off and then high-side ACCUFET 41 is turned on. Both ACCUFETs cannot be on at the same time, however, or a direct current path from $V_{batt}$ to ground would be created, leading to a large current and most likely the destruction of both devices. Thus, at time $T_1$ in FIG. 4B, ACCUFET 42 is turned off by switching its gate voltage from $V_{batt}$ to ground. However, current flowing through coil 43 resists an abrupt cutoff, and $V_o$ therefore increases rapidly to a level greater than $V_{batt}$, as shown by the top curve in FIG. 4B. $V_o$ will increase until ACCUFET 42 either breaks down or is destroyed. Meanwhile, the $V_{GS}$ in ACCUFET 41 falls rapidly at an equal rate (its source being biased more positively than its gate). It is highly likely that in this situation the gate oxide of ACCUFET 41 will rupture before ACCUFET 42 begins to conduct and thereby attempt to clamp the output voltage $V_o$.

A scenario similar to that shown in FIGS. 4A–4B will occur in virtually any situation in which an ACCUFET is used to switch currents through an inductive load.

Accordingly, there is a real need for a device which has the superior cell density and on-resistance characteristics of an ACCUFET yet is able to switch an inductive load or survive voltage spikes of limited energy in a reliable manner particularly without damaging the trench gate.

SUMMARY OF THE INVENTION

The ACCUFET of this invention includes a plurality of cells bordered by trench gates and containing semiconductor material of a selected conductivity. Each of the trench gates includes a conductive gate material, typically polysilicon, and an insulating layer, typically silicon dioxide, which insulates the conductive gate material from the semiconductor material in each cell. In order to limit the electric field imposed on the gate oxide layer, a protective region of conductivity opposite of that of the semiconductor material in the cell is created, thereby creating a PN junction which acts as a protective diode connected in parallel with the current path through the ACCUFET cell. The doping levels and location of the PN junction are set so as to establish a breakdown voltage for the diode which prevents the voltage across the gate oxide layer from reaching a level which would cause the gate oxide layer to rupture or be damaged. The diode should also clamp and therefore minimize the maximum silicon electric field in the vicinity of the gate to minimize or prevent the formation of hot carriers.

In the preferred embodiment, the protective region of conductivity opposite to the conductivity of the ACCUFET cells is formed in an adjacent cell. The cells may be in the form of longitudinal stripes or they may have a hexagonal, square, polygonal or other shape. Preferably, the protective regions are formed in a repetitive pattern across the ACCUFET such there is one protective region for a selected number of ACCUFET cells.

BRIEF DESCRIPTION OF THE DRAWING

FIG. 3A illustrates the changes in the depletion region as an ACCUFET changes from an on condition to an off condition.

FIG. 3B illustrates schematically the strength of the electric field in the gate oxide layer and epitaxial layer of the ACCUFET of FIG. 3A as it changes from an on condition to an off condition.

DESCRIPTION OF THE INVENTION

Figure 1:
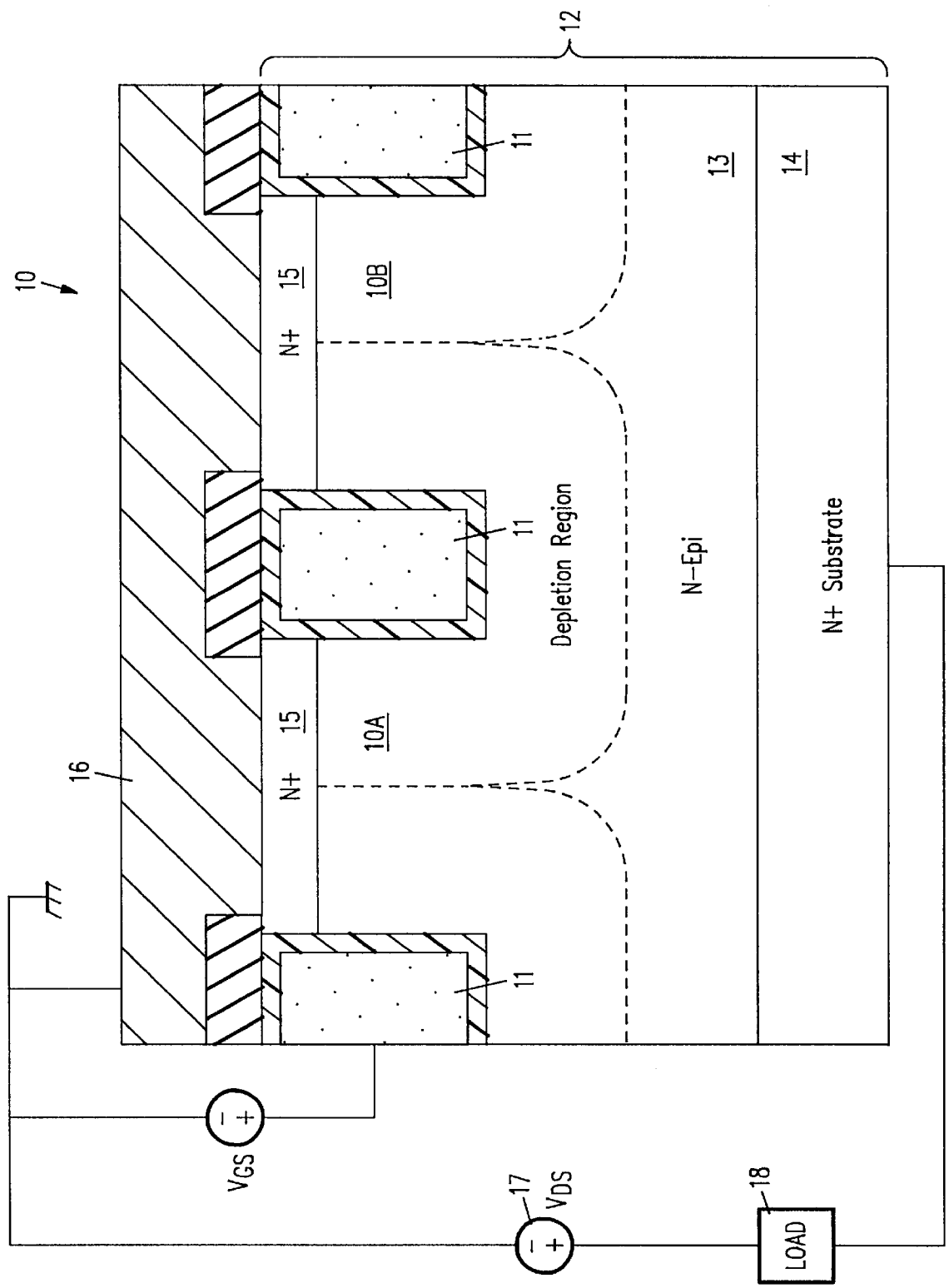
FIG. 1 illustrates a cross-sectional view of a conventional accumulation-mode MOSFET (ACCUFET).
Figure 2C:
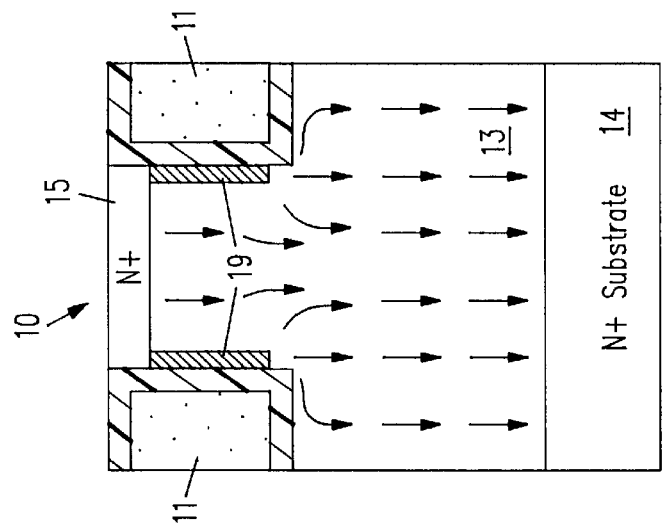
FIG. 2C illustrates a fully-on ACCUFET.
Figure 2B:
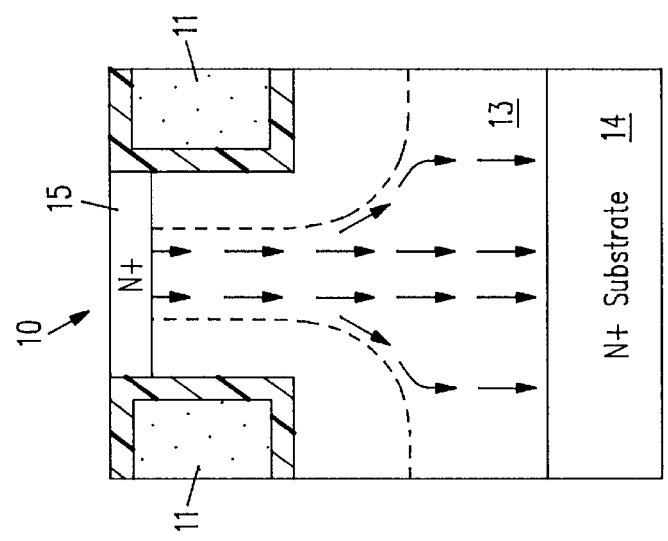
FIG. 2B illustrates a partially-on ACCUFET.
Figure 2A:
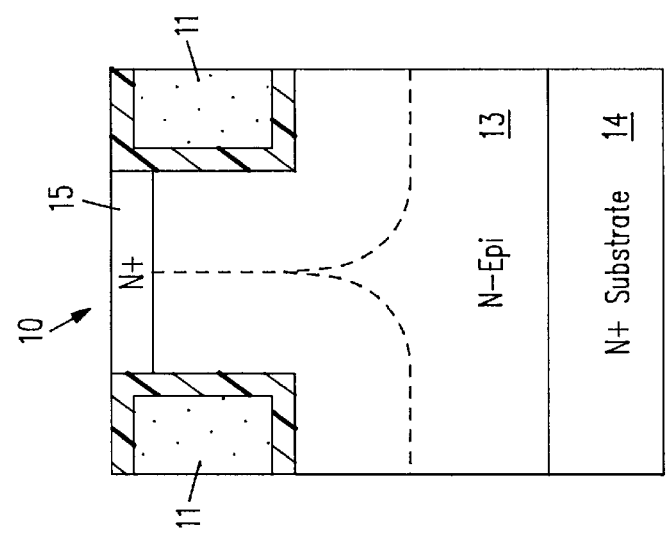
FIG. 2A illustrates an ACCUFET in an off condition.
Figure 4B:
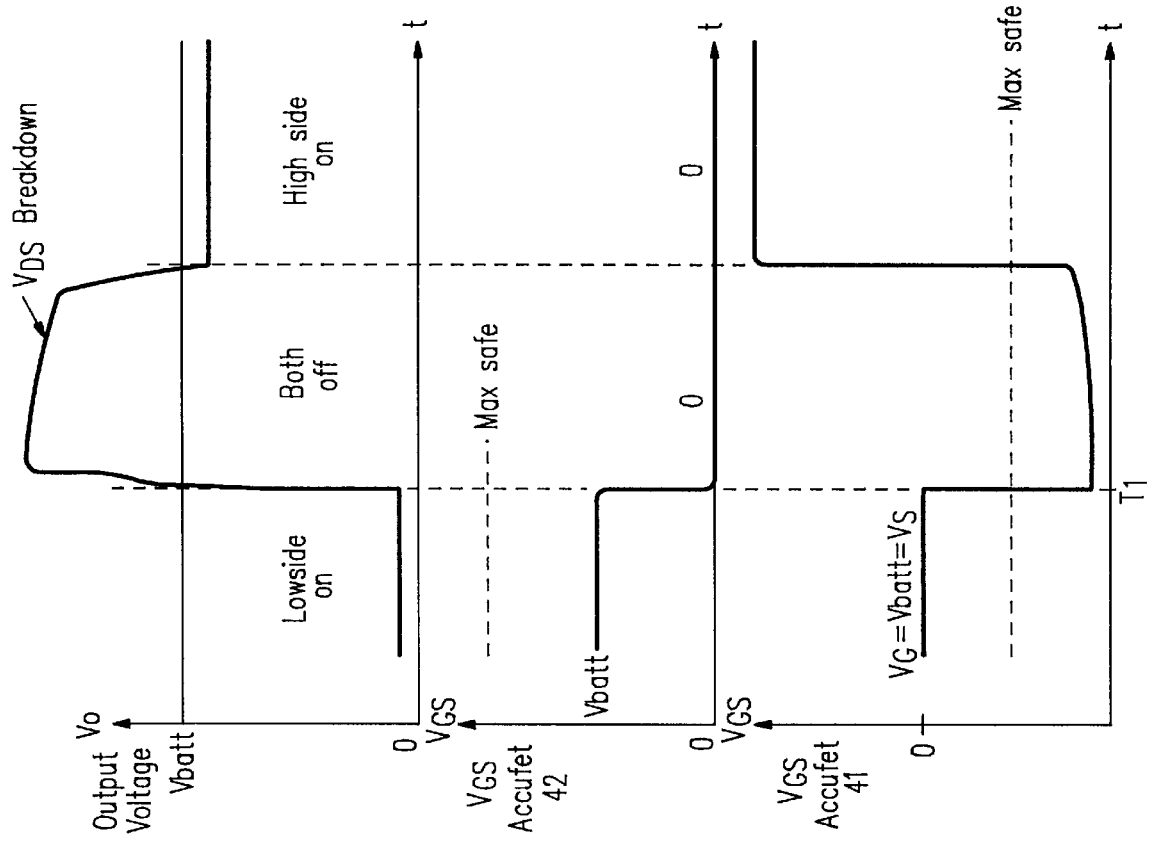
FIG. 4B illustrates graphs which show the voltages at the output of the bridge circuit and across the gate oxides of the ACCUFETs shown in FIG. 4A.
Figure 4A:
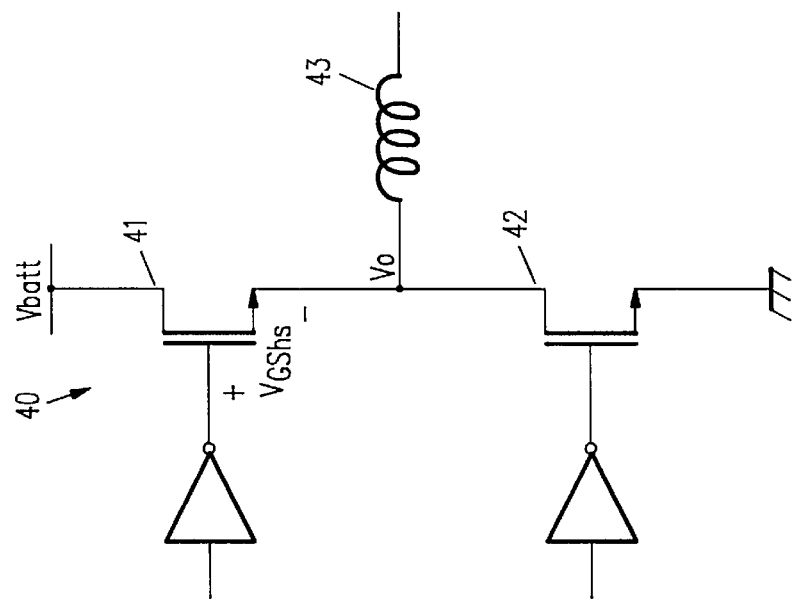
FIG. 4A illustrates a push-pull halfbridge circuit containing two ACCUFETs connected to an inductive load.
Figure 5B:
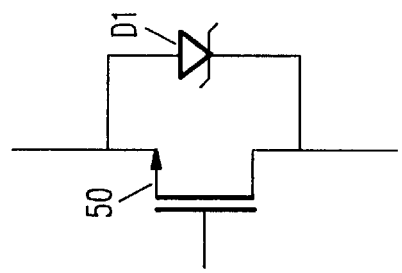
FIG. 5B illustrates a diagram of an equivalent circuit for the ACCUFET shown in FIG. 5A.
Figure 5A:
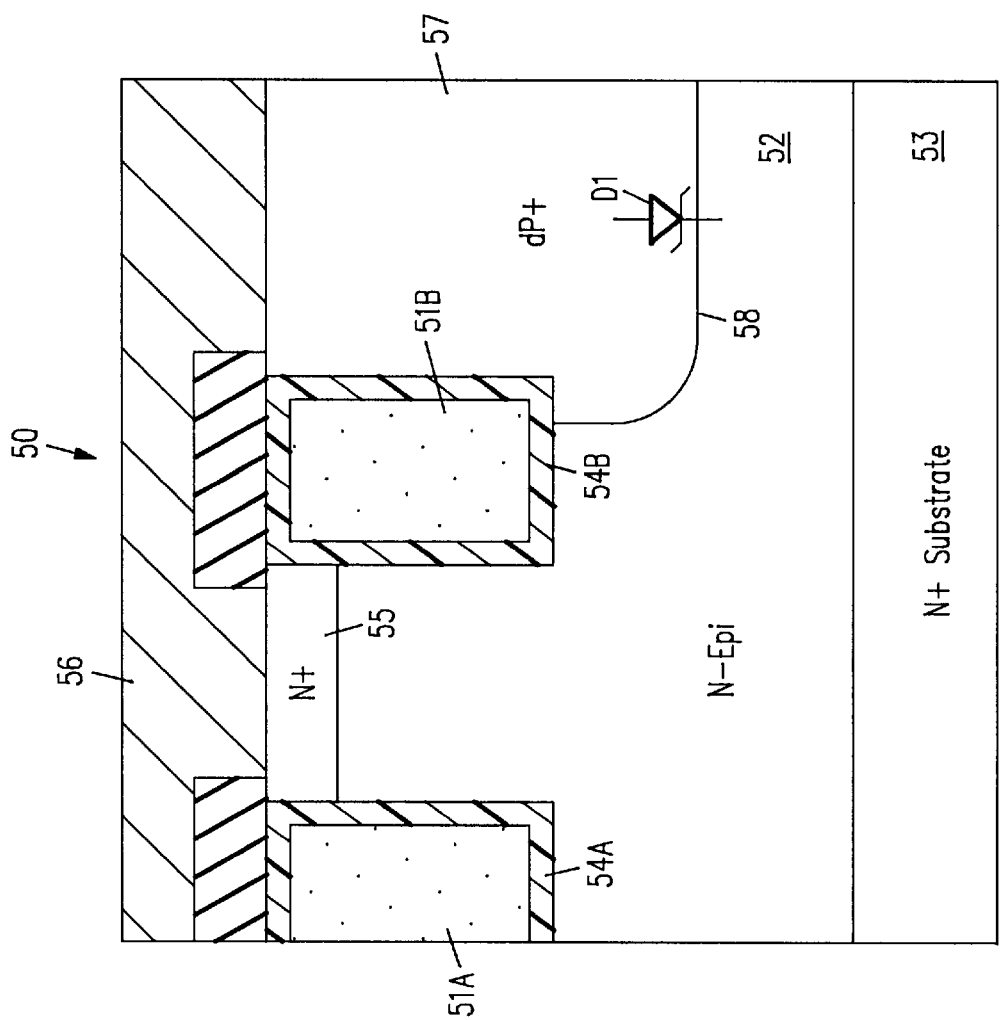
FIG. 5A illustrates a cross-sectional view of a voltage-clamped ACCUFET in accordance with the invention.

An ACCUFET in accordance with the invention is shown in FIG. 5A. ACCUFET 50 includes trench gates 51A and 51B formed in an N-epitaxial layer 52 which is grown on the surface of an N+ substrate 53. Gates 51A and 51B are insulated from N-epitaxial layer 52 by gate oxide layers 54A and 54B, respectively. A shallow N+ region 55 at the surface of epitaxial layer 52 makes contact with a metal layer 56. N-epitaxial layer 52 would typically be doped to a concentration of $1\times10^{14}$ to $1\times10^{15}$ cm$^{-3}$. Gates 51A and 51 are preferably polysilicon doped with boron to a concentration of $8\times10^{18}$ to $5\times10^{19}$ cm$^{-3}$. Gate oxide layers 54A and 54B are typically 90–1000 Å thick, and the distance between gates 51A and 51B is typically about 1.0 μm but may range from 0.5 to 4.0 μm.

N+ substrate 53 serves as the drain of ACCUFET 50 and may be contacted from the bottom. Alternatively, a submerged N+ layer instead of the N+ substrate could be used as the drain, and the drain could be contacted from the top side of the structure by means of, for example, an N+ sinker region and a top side contact. To provide protection for gate oxide layers 54A and 54B, a deep P+ region 57 is formed in epitaxial layer 52, creating a PN junction which functions as a diode (symbolized as diode D1).

FIG. 5B shows an equivalent circuit for the ACCUFET shown in FIG. 5A. As indicated, diode D1 is in parallel with the main current path through ACCUFET 50. It should be noted that integrating diode D1 inside of ACCUFET 50 achieves a different result from simply placing an external diode in parallel with an ACCUFET. In integrating the diode, series inductance in the diode (which occurs in a discrete, multichip or PCB version) is eliminated, allowing the diode to clamp the internal voltages within the ACCUFET nearly instantaneously (no overshoot). Moreover, the diodes can be distributed throughout the device to provide a uniform degree of clamping.

As noted above, the voltages at the gates 51A and 51B and the source (N+ region 55) are essentially the same when MOSFET 50 is turned off. Since N+ region 55 is tied to deep P+ region 57 via metal layer 56, when MOSFET 50 is turned off the voltage across gate oxides 54A and 54B cannot exceed the voltage across diode D1. If diode D1 is reverse-biased, the voltage across diode D1 is limited to its breakdown voltage; if diode D1 is forward-biased, then the voltage across diode D1 is limited to a normal diode drop (typically about 0.7 V).

The breakdown voltage of diode D1 is established by controlling the respective doping concentrations of deep P+ region 57, N-epitaxial layer 52 and N+ substrate 53, as well as the separation between PN junction 58 and the interface between N-epitaxial layer 52 and N+ substrate 53. For a normal ACCUFET, the doping concentration of N-epitaxial layer 52 would be in the range of $10^{14}$ to $10^{15}$ cm$^{-3}$ to permit the ACCUFET to be turned off. N+ substrate 53 has a resistivity of 3 mΩ-cm, and deep P+ region 57 has a sheet resistance of 40 to 150 Ω/□. N-epitaxial layer 52 is 2.5 to 5.0 μm thick, but the net thickness from the bottom of deep P+ region 57 to N+ substrate 53 is 0.3 to 1.5 μm.

Figure 6A:
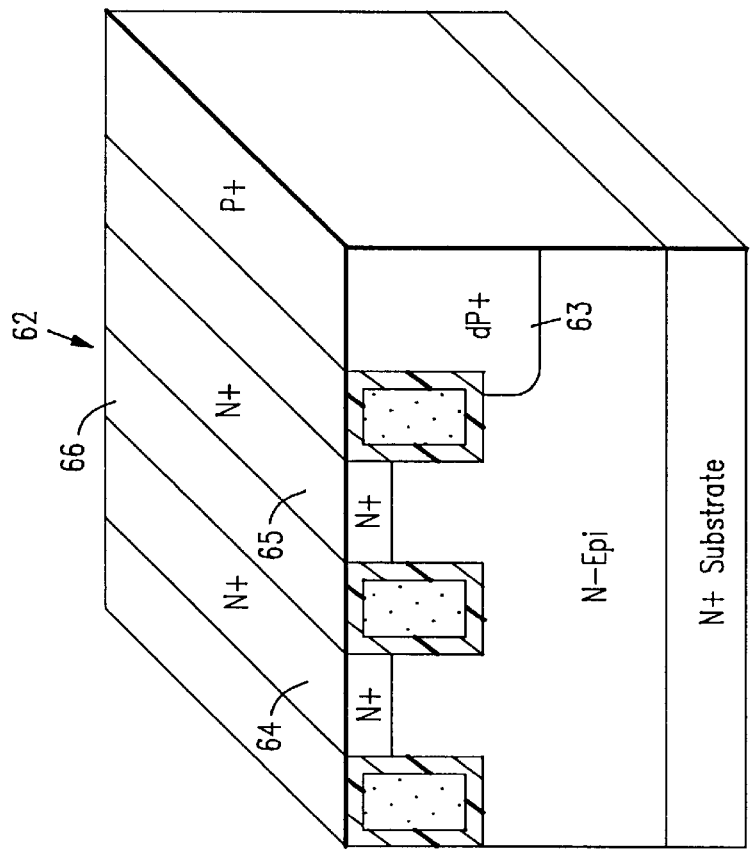
FIGS. 6A and 6B show three-dimensional cross-sectional views of alternative ACCUFET structures in accordance with the invention, FIG. 6A showing a square cell structure and FIG. 6B showing a striped cell structure.
Figure 6B:
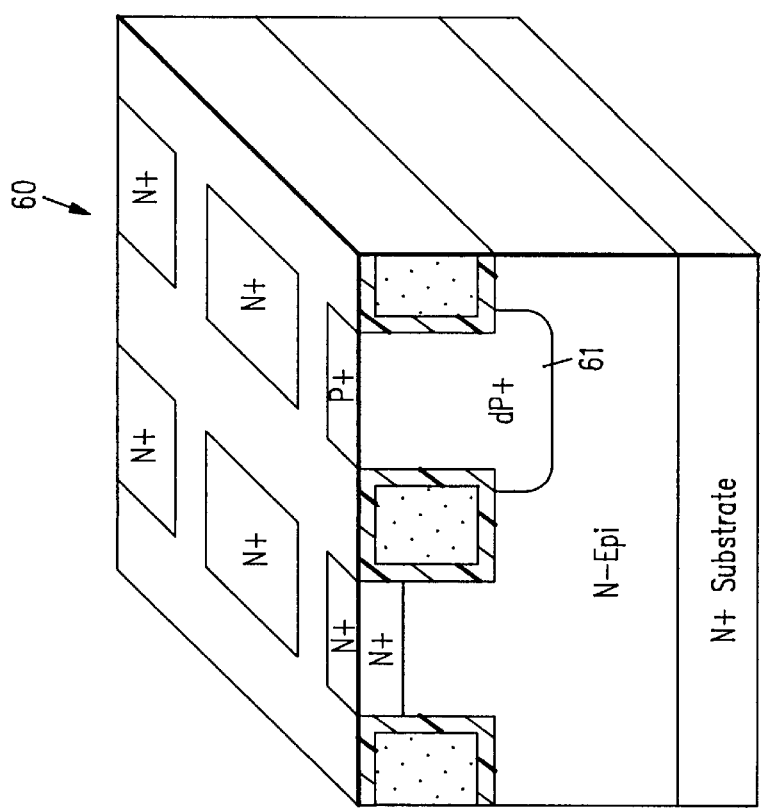

FIGS. 6A and 6B show three-dimensional cross-sectional views of alternative ACCUFET structures in accordance with this invention. ACCUFET 60 shown in FIG. 6A is formed with a pattern of square or rectangular cells, with a deep P+ region 61 being formed in one of the cells. In ACCUFET 62 shown in FIG. 6B the cells are formed in stripes, with a deep P+ region 63 occupying one of the cells.

Figure 7:
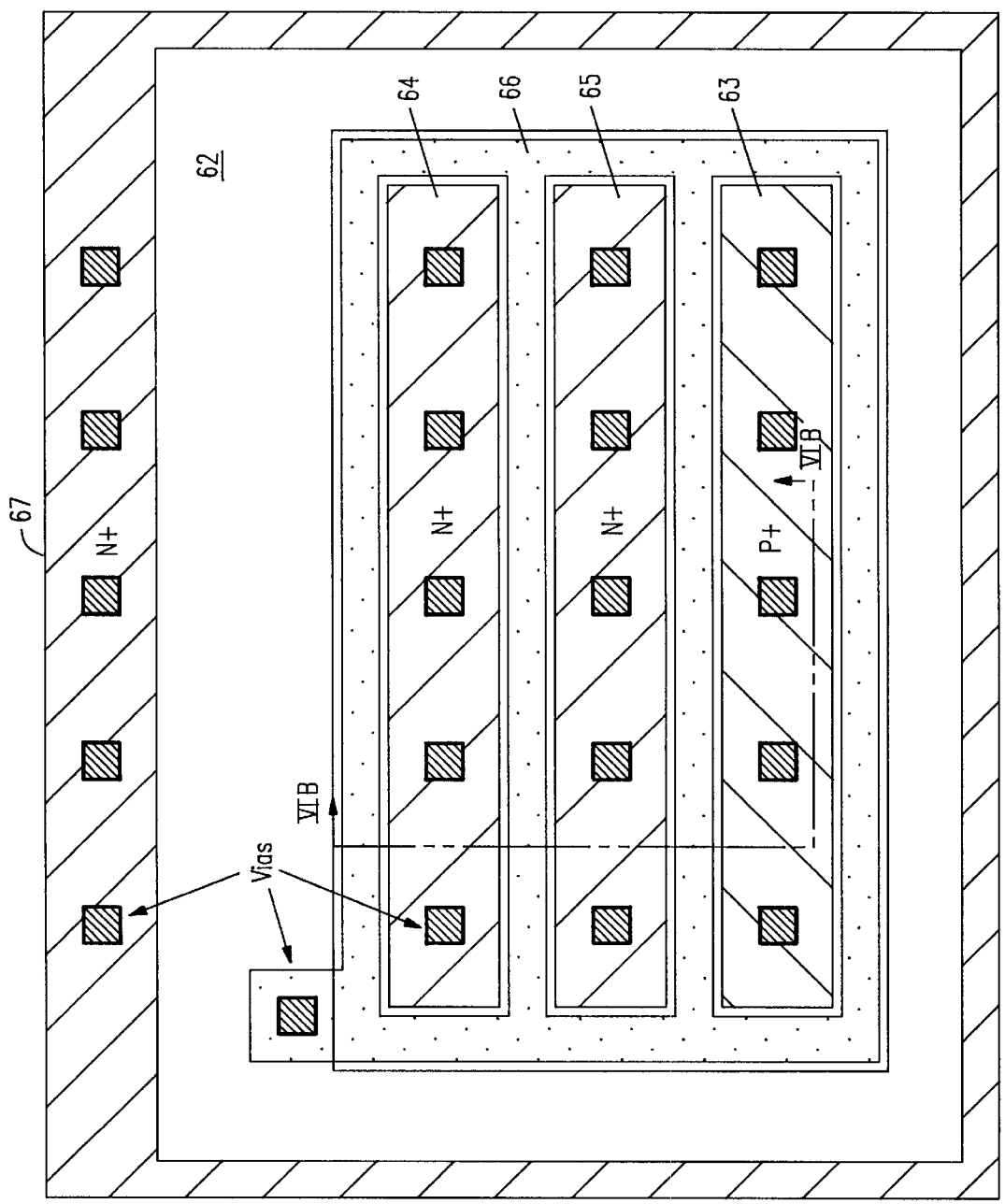
FIG. 7 illustrates a top view of the ACCUFET shown in FIG. 6B.

FIG. 7 illustrates a top view of MOSFET 62 shown in FIG. 6B, with the cross-section of FIG. 6B being shown as VIB—VIB. As indicated, a number of contacts connect a metal contact layer (not shown) to N+ source regions 64 and 65 and P+ region 63. An N+ region 67, formed at the perimeter of the structure, is used to make contact with the N+ substrate. Alternatively, the N+ substrate could be contacted from the back side.

Figure 8:
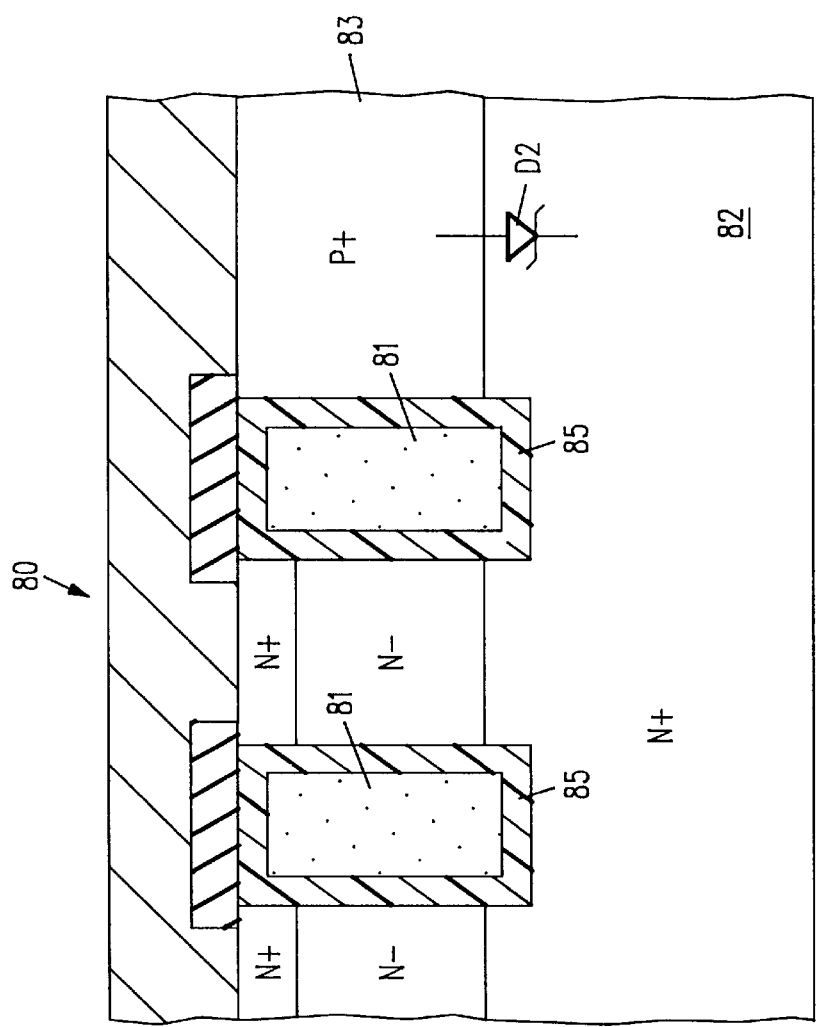
FIG. 8 shows an alternative embodiment in accordance with the invention wherein the gate trenches extend into the heavily-doped substrate.

FIG. 8 illustrates an alternative embodiment including a MOSFET 80 in which the trench gates 81 extend into the N+ substrate 82. Since N+ substrate 82 is unable to support a significant voltage difference, the gate oxide layers 85 are exposed to the entire voltage difference across the ACCUFET when it is turned off. In other words, there is no lightly-doped N-epitaxial layer to absorb a portion of the voltage drop across the device. As a result, the doping concentrations of P+ region 83 and N+ substrate 82 must be carefully established such that diode D2 breaks down before gate oxide layer 85 ruptures. According to the industry standard, the gate oxide layer should not be exposed to a voltage difference of more than 4 MV/cm times the thickness of the oxide layer expressed in cm. For example, a gate oxide layer 400 Å thick will rupture at about 32V, and the breakdown voltage of diode D2 should therefore be about 16V. With a gate oxide layer 175 Å thick, a clamping voltage of about 8V is needed.

Although there are numerous processes for fabricating an ACCUFET in accordance with this invention, FIGS. 9A–9E illustrate an exemplary process for fabricating ACCUFET 50 shown in FIG. 5A.

Figure 9A:
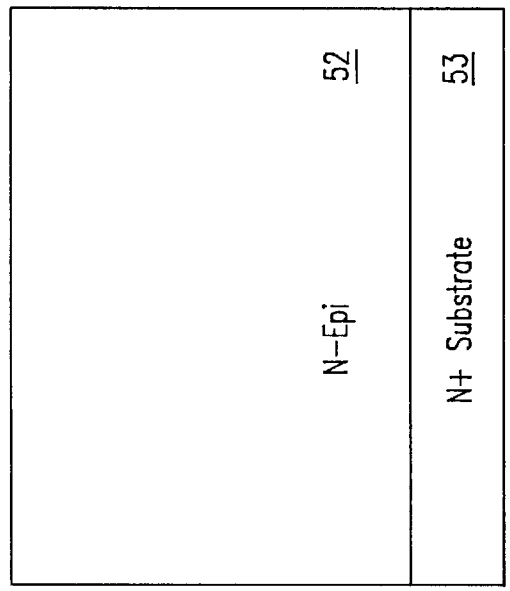
FIGS. 9A–9E illustrate the steps of a process for fabricating the ACCUFET shown in FIG. 5A.

Referring to FIG. 9A, the starting point is a conventional N+ substrate 53 on which an N-epitaxial layer 52 is grown using known processes.

Figure 9D:
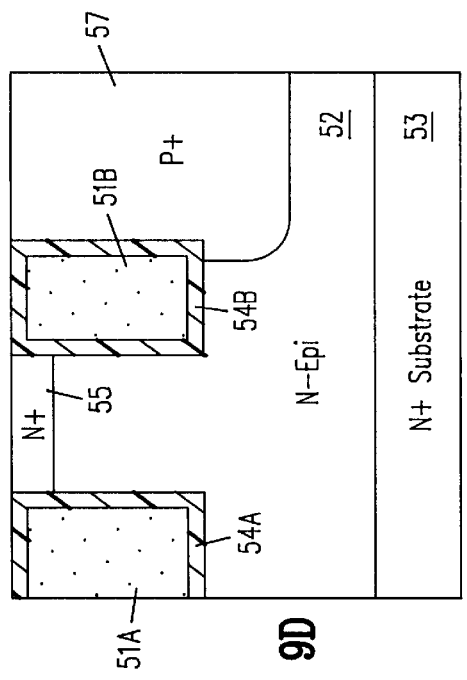
Figure 9E:
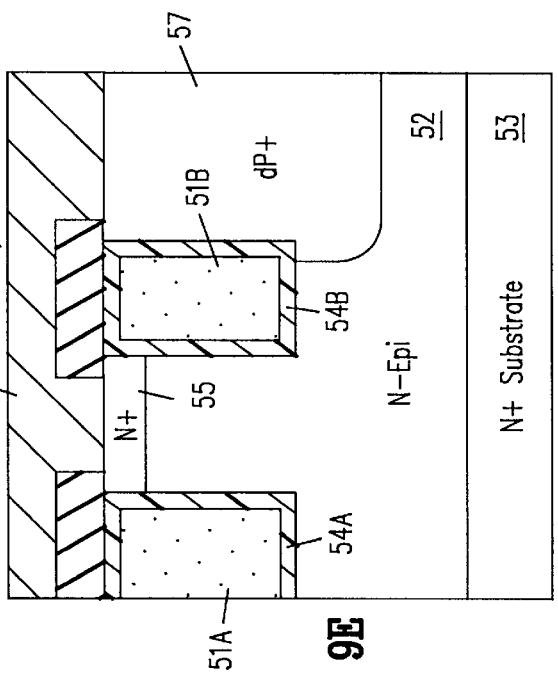
Figure 9B:
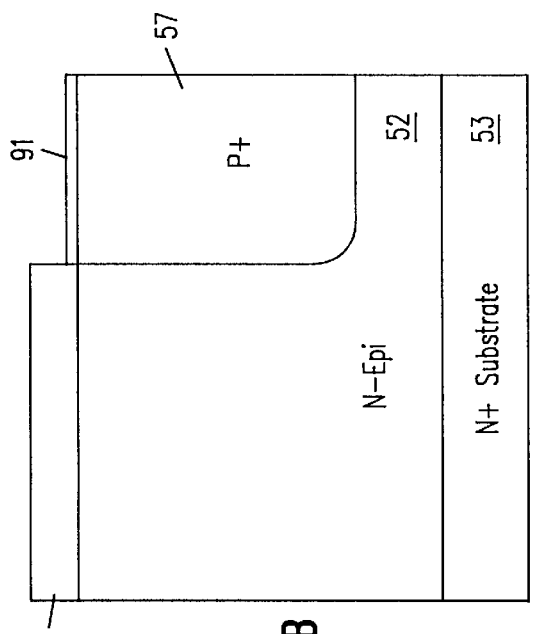
Figure 9C:
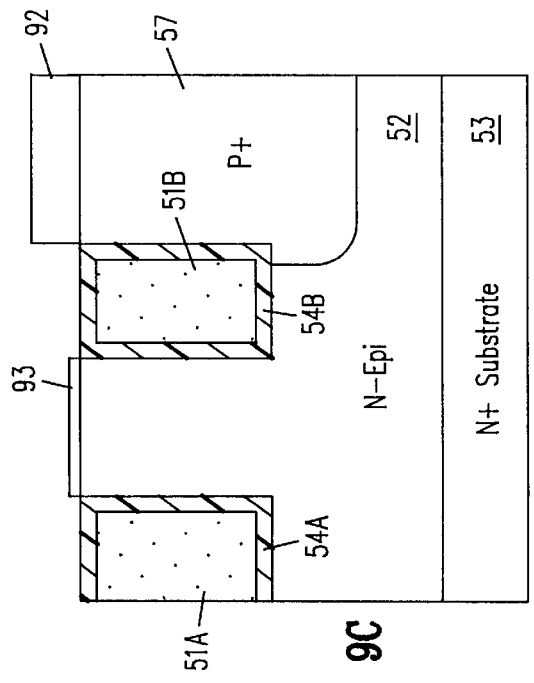

A thick oxide layer 90 is grown, masked and etched, and a thin oxide layer 91 is grown on the top surface of the structure where deep P+ region 57 is to be formed. Deep P+ region 57 is then implanted through thin oxide layer 91 at a dose of $1 \times 10^{14}$ to $7 \times 10^{15}$ cm$^{-2}$ and an energy of 60–100 keV. The resulting structure is illustrated in FIG. 9B. Oxide layers 90 and 91 are then removed.

In one version of the process, a thick oxide layer 92 is grown and removed by photomasking except over deep P+ region 57, and a thin oxide layer 93 is grown. Thin oxide layer 93 is masked and removed from the portions of the structure where the trenches are to be formed, as shown in FIG. 19C. The trenches are then masked and etched using known techniques of reactive ion or plasma dry etching. Then the trench is oxidized to form gate oxide layers 54A and 54B, and polysilicon is deposited into the trench until it overflows the top of the trench. The polysilicon is then doped with phosphorus by POCl$_3$ predeposition or ion implantation at a dose of $5 \times 10^{13}$ to $5 \times 10^{15}$ cm$^{-2}$ and an energy of 60 keV, giving it a sheet resistance of 20–70 Ω/□. For a P-channel device, the polysilicon is doped with boron using ion implantation to a sheet resistance of roughly 40–120 Ω/□. The polysilicon is then etched back until it is planar with the surface of the trench except where a mask protects it, so that it can subsequently be contacted with metal.

The N+ source region 55 is then introduced using a mask and an arsenic ion implantation (or a boron ion implantation for a P-channel device) at a dose of $5 \times 10^{14}$ to $1 \times 10^{16}$ cm$^{-2}$ at 20 to 100 keV. The resulting structure is shown in FIG. 9D.

A thin oxide layer is thermally grown. Borophosphosilicate glass (BPSG) is then deposited on the surface of the structure. The BPSG is momentarily heated to around 850° to 950° C. to flow smoothly and flatten the surface topology of the die. Contact holes are etched in the oxide and BPSG layers, and metal layer 56 is deposited, forming contacts through the contact holes to the N+ source region 55 and the deep P+ region 57. This yields ACCUFET 50 shown in FIG. 9E. The die is then passivated with SiN or low-temperature BPSG, and pad mask windows are etched to facilitate bonding.

While specific embodiments of this invention have been described, it should be understood that such embodiments are illustrative only and not limiting. Numerous alternative embodiments in accordance with the broad principles of this invention will be apparent to those skilled in the art.

We claim:

1. An accumulation-mode field-effect transistor comprising:
   a semiconductor material;
   a gate positioned in a trench at a surface of said semiconductor material and separated from said semiconductor material by a gate insulating layer, said gate defining a transistor cell, said cell containing substantially only material of a first conductivity type;
   a heavily-doped region of said first conductivity type located at a surface of said cell;
   a lightly-doped region of said first conductivity type adjacent said heavily-doped region;
   a PN junction within said semiconductor material, said PN junction forming a diode, said diode being connected in parallel with a current path through said cell, wherein said diode operates to break down and thereby prevent damage to said gate insulating layer.

2. The transistor of claim 1 wherein said semiconductor material includes an epitaxial layer formed on a substrate.

3. The transistor of claim 2 wherein said trench extends only into said epitaxial layer.

4. The transistor of claim 2 wherein said trench extends through said epitaxial layer and into said substrate.

5. The transistor of claim 4 comprising a region of a second conductivity type located on an opposite side of said gate from said cell, said PN junction being formed at a boundary of said region of second conductivity type.

6. The transistor of claim 5 wherein said PN junction is formed at an interface between said epitaxial layer and said substrate.

7. The transistor of claim 4 wherein said diode has a breakdown voltage which is less than $4 \times 10^6$ volts/centimeter multiplied by the thickness of said insulating layer expressed in centimeters.

8. The transistor of claim 1 comprising a region of second conductivity type located on an opposite side of said gate from said cell, said PN junction being formed at a boundary of said region of second conductivity type.

9. The transistor of claim 8 comprising a plurality of said cells and a plurality of said regions of said second conductivity type.

10. The transistor of claim 9 wherein there is one region of said second conductivity type for a predetermined number of said cells.

11. The transistor of claim 1 wherein the doping levels and location of said PN junction are set so as to establish a breakdown voltage for said diode which prevents the voltage across said gate insulating layer from reaching a level which would cause said gate insulating layer to be damaged.

12. An accumulation-mode field-effect transistor comprising:
   a semiconductor material;
   a gate positioned in a trench at a surface of said semiconductor material and separated from said semiconductor material by a gate insulating layer, said gate defining a transistor cell, said cell containing substantially only material of a first conductivity type;
   a heavily-doped region of said first conductivity type located at a surface of said cell;
   a lightly-doped region of said first conductivity type adjacent said heavily-doped region;
   a PN junction within said semiconductor material, said PN junction forming a diode, said diode being connected in parallel with a current path through said cell, wherein said PN junction extends to a level in said semiconductor material below a bottom of said trench.

13. The transistor of claim 12 comprising a region of second conductivity type located on an opposite side of said gate from said cell, said PN junction being formed at a boundary of said region of second conductivity type.

14. The transistor of claim 13 comprising a plurality of said cells and a plurality of said regions of said second conductivity type.

15. The transistor of claim 14 wherein there is one region of said second conductivity type for a predetermined number of said cells.

16. An accumulation-mode field-effect transistor comprising:
   a semiconductor material;
   a gate positioned in a trench at a surface of said semiconductor material and separated from said semiconductor material by a gate insulating layer, said gate defining a transistor cell, said cell containing substantially only material of a first conductivity type;
   a heavily-doped region of said first conductivity type located at a surface of said cell;
   a lightly-doped region of said first conductivity type adjacent said heavily-doped region;
   a PN junction extending from sad trench within said semiconductor material, said PN junction forming a diode, said diode being connected in parallel with a current path through said cell, wherein said PN junction has a deepest point which is at a location lower than a point at which said PN junction meets said trench.

17. The transistor of claim 16 comprising a region of second conductivity type located on an opposite side of said gate from said cell, said PN junction being formed at a boundary of said region of second conductivity type.

18. The transistor of claim 17 comprising a plurality of said cells and a plurality of said regions of said second conductivity type.

19. The transistor of claim 18 wherein there is one region of said second conductivity type for a predetermined number of said cells.

20. An accumulation-mode field-effect transistor comprising:
   a semiconductor material, said semiconductor material including an epitaxial layer formed on a substrate;
   a gate positioned in a trench at a surface of said semiconductor material and separated from said semiconductor material by a gate insulating layer, said gate defining a transistor cell, said cell containing substantially only material of a first conductivity type, said trench extending through said epitaxial layer and into said substrate;
   a heavily-doped region of said first conductivity type located at a surface of said cell;
   a lightly-doped region of said first conductivity type adjacent said heavily-doped region;
   a region of a second conductivity type located on an opposite side of said gate from said cell, a PN junction being formed at a junction of said region of second conductivity type and said substrate, said PN junction forming a diode, said diode being connected in parallel with a current path through said cell, wherein said diode is adapted so as to have a breakdown voltage which is less than a voltage required to damage said gate insulating layer when said transistor is in an off condition.

* * * * *

UNITED STATES PATENT AND TRADEMARK OFFICE
CERTIFICATE OF CORRECTION

PATENT NO. : 5,856,692
ISSUE DATE : 01/05/99
INVENTOR(S) : Williams, Richard K.; Mallikarjunaswamy, S.

It is certified that error appears in the above-identified patent and that said Letters Patent is hereby corrected as shown below:

Claim 16, column 8, line 1, delete "sad" and substitute --said--.

Signed and Sealed this

Twenty-sixth Day of December, 2000

Attest:

Q. TODD DICKINSON

*Attesting Officer*      *Director of Patents and Trademarks*